United States Patent
Jeong et al.

(10) Patent No.: US 7,521,706 B2
(45) Date of Patent: Apr. 21, 2009

(54) PHASE CHANGE MEMORY DEVICES WITH CONTACT SURFACE AREA TO A PHASE CHANGEABLE MATERIAL DEFINED BY A SIDEWALL OF AN ELECTRODE HOLE AND METHODS OF FORMING THE SAME

(75) Inventors: Won-Cheol Jeong, Seoul (KR); Hyeong-Jun Kim, Seoul (KR); Jae-Hyun Park, Seoul (KR); Chang-Wook Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 865 days.

(21) Appl. No.: 10/942,187

(22) Filed: Sep. 16, 2004

(65) Prior Publication Data

US 2005/0110983 A1 May 26, 2005

(30) Foreign Application Priority Data

Nov. 24, 2003 (KR) ...................... 10-2003-0083551

(51) Int. Cl.
*H01L 47/00* (2006.01)
*H01L 29/02* (2006.01)
*H01L 29/04* (2006.01)
(52) U.S. Cl. .................................. 257/3; 257/2; 257/4
(58) Field of Classification Search .................. 257/1–4
See application file for complete search history.

(56) References Cited

U.S. PATENT DOCUMENTS

| 5,933,365 | A | 8/1999 | Klersy et al. ................. 365/148 |
| 6,867,425 | B2 * | 3/2005 | Wicker ........................... 257/3 |
| 7,026,639 | B2 * | 4/2006 | Cho et al. ........................ 257/3 |
| 2005/0045915 | A1 * | 3/2005 | Lee ............................. 257/202 |

FOREIGN PATENT DOCUMENTS

KR 1020040053766 6/2004

OTHER PUBLICATIONS

Notice to File a Response/Amendment to the Examination Report for Korean Patent Application No. 10-2003-0083551 mailed on Sep. 30, 2005.

* cited by examiner

*Primary Examiner*—Anh Phung
*Assistant Examiner*—Allison P Bernstein
(74) *Attorney, Agent, or Firm*—Myers Bigel Sibley & Sajovec

(57) ABSTRACT

Phase change memory devices and methods of making phase changeable memory devices including a heating electrode disposed on a substrate are provided. The heating electrode includes an electrode hole in the heating electrode. A phase change material pattern is provided in the electrode hole and contacts a sidewall of the electrode hole. In some embodiments, the electrode hole extends through the heating electrode. In some embodiments, the phase changeable material pattern only contacts the electrode at a sidewall of the electrode hole.

11 Claims, 6 Drawing Sheets

PHASE CHANGE MEMORY DEVICES WITH CONTACT SURFACE AREA TO A PHASE CHANGEABLE MATERIAL DEFINED BY A SIDEWALL OF AN ELECTRODE HOLE AND METHODS OF FORMING THE SAME

CLAIM OF PRIORITY

This application claims priority from Korean Patent Application No. 2003-083551, filed on Nov. 24, 2003, in the Korean Intellectual Property Office, the contents of which are hereby incorporated by reference in their entirety as if set forth fully herein.

FIELD OF THE INVENTION

The present invention relates to semiconductor devices and methods of forming the same and, more particularly, to phase change memory devices and methods of forming the same.

BACKGROUND OF THE INVENTION

In non-volatile memory devices, unit cells of the device maintain data stored in the unit cells even when a power supply is cut off. Widely used non-volatile memory devices include flash memory devices. Unit cells of conventional flash memory devices, typically, have an electrically insulated floating gate. Depending on whether the electrons in the floating gate exist or not (or a variation of an amount of the electrons), the data stored in the flash memory cell may be detected as logical "1" or logical "0" values.

The flash memory cell typically uses a high operation voltage (i.e. a program voltage or an erase voltage) to inject the electrons into the floating gate or to extract the electrons from the floating gate. Therefore, conventional flash memory devices typically use a peripheral circuit for controlling the high operation voltage. Furthermore, fabrication of conventional flash memory devices may be complicated. In addition, power dissipation of the flash memory device may increase as a result of the high operation voltage.

A phase change memory device has been proposed as a non-volatile memory device. The phase change memory device uses phase change material to store data. The phase change material, typically, has an amorphous state and a crystalline state. The phase change material in the amorphous state, typically, has a resistivity higher than that of the phase change material in the crystalline state. Therefore, the logic information stored in a unit cell of the phase change memory device may be determined by sensing the current flowing through the phase change material. Widely-known phase change materials include GST (or Ge—Te—Sb) which is a compound including germanium Ge, tellurium Te and stibium Sb.

Typically, the phase change material is converted into the amorphous state and the crystalline state by heat. Specifically, if heat close to a melting point of the phase change material is supplied to the phase change material and then the phase change material is cooled rapidly, the phase change material is converted to the amorphous state. In contrast, if heat corresponding to a crystallizing temperature lower than the melting point is supplied to the phase change material for a long time and then the phase change material is cooled, the phase change material is converted to a crystalline state. For example, if the GST is supplied with heat to approximately a melting point (about 610° C.) and then cooled rapidly (for about 1 ns), the GST is converted to an amorphous state. If the GST is supplied with heat to the crystallizing temperature (about 450° C.) for a relatively long time (30~50 ns) and then cooled, the GST is converted to a crystalline state.

Conventionally, the heat supplied for conversion of the phase change material is Joule's heat. That is, the current flowing through the phase change material is used to generate Joule's heat, such that the phase change material is heated.

One example of a phase change memory cell is disclosed in U.S. Pat. No. 5,933,365 by Patrick Klersy et al. FIG. 1 is a cross-sectional view illustrating such a conventional phase change memory device. Referring to FIG. 1, a first heating layer 3 is disposed on a first dielectric layer 1, and a first electrical contact layer 2 is interposed between a portion of the first heating layer 3 and the first dielectric layer 1. The second dielectric layer 4 covers the first dielectric layer 3. A contact hole 5 is formed to penetrate the second dielectric layer 4 and to expose a predetermined region of the first heating layer 3. A phase change material layer 6 contacts the first heating layer 3 through the contact hole 5 and is disposed on the second dielectric layer 4. A second heating layer 7 and a second electrical contact layer 8 are sequentially stacked on the phase change material layer 6. The contact area of the phase change material layer 6 and the first heating layer 3 is identical to an area of the first heating layer 3 exposed in the contact hole 5.

An amount of current flowing through the contact hole 5 (i.e., a contact surface of the first heating layer 3 and the phase change material layer 6) is controlled to convert a portion of the phase change layer 6 neighboring the contact surface into an amorphous state or a crystalline state.

In a conventional phase change memory cell, the amount of the operation current for converting the phase change material layer 6 into an amorphous state or a crystalline state depends on the area of the contact surface of the phase change material layer 6 and the first heating layer 3. That is, as a width W0 of the contact hole 5 related to an area of the contact surface decreases, a density of current flowing through the contract hole 5 increases. It is well known to those skilled in the art that the Joule's heat increases in proportion to the current density. As a result, as a width W0 of the contact hole 5 decreases, the amount of operation current decreases. Conventionally, a width W0 of the contact hole 5 depends on a photolithographic pattern defined by the photolithographic process, such that a minimum width of the contact hole 5 typically depends on the minimum width limitation of the photolithographic process.

SUMMARY OF THE INVENTION

Some embodiments of the present invention provide phase change memory devices and methods of making phase changeable memory devices including a heating electrode disposed on a substrate. The heating electrode includes an electrode hole extending through the heating electrode. A phase change material pattern is provided in the electrode hole and contacts a sidewall of the electrode hole.

In some embodiments of the present invention, an insulation layer is provided on the heating electrode and includes a guide hole extending through the insulation layer. The phase change material pattern is disposed on the insulation layer and in the guide hole and a portion of the phase change material pattern extends through the guide hole to the electrode hole and contacts the sidewall of the electrode hole. The sidewall of the electrode hole and the sidewall of the guide hole may be arranged in a straight line. The sidewall of the guide hole may be inclined such that a bottom end width of the guide hole is smaller than a top end width the guide hole.

In still further embodiments of the present invention, a spacer is provided on the sidewall of the guide hole and on the heating electrode and a width of the electrode hole is smaller than that of the guide hole.

In additional embodiments of the present invention, a conductive capping pattern is disposed on a top surface of the phase change material pattern. The conductive capping pattern has a sidewall aligned to a sidewall of the phase material pattern.

In yet other embodiments of the present invention, a lower interlayer dielectric layer is interposed between the heating electrode and the substrate. A lower plug extends through the lower dielectric layer to contact a predetermined region of the substrate. A top surface of the lower plug is electrically connected to the heating electrode. Additionally, an upper interlayer dielectric layer covering the phase change material pattern may be provided with an upper plug extending through the upper interlayer dielectric layer to electrically connect to the phase change material pattern. The lower plug and the upper plug may be aligned to a virtual line perpendicular to a top surface of the substrate. The guide hole and the electrode hole may be offset from the lower plug and/or the upper plug.

In still further embodiments of the present invention, the phase changeable material pattern only contacts the heating electrode through a sidewall of the contact hole.

In additional embodiments of the present invention, a phase change memory device is formed by forming a heating electrode on a predetermined region of the substrate, forming an electrode hole extending through the heating electrode and forming a phase change material pattern contacting a sidewall of the electrode hole.

Further embodiments of the present invention include forming a lower interlayer dielectric layer on the substrate and forming a lower plug extending through the lower interlayer dielectric layer to contact a predetermined region of the substrate. In such embodiments, forming a heating electrode further includes forming a heating electrode on the lower interlayer dielectric to contact a top surface of the lower plug. The guide hole and the electrode hole may be offset from the lower plug.

Additional embodiments of the present invention include forming an insulation layer covering the heating electrode and patterning the insulation layer to form a guide hole penetrating a predetermined region of the insulation layer and disposed in a region of the heating electrode corresponding to the electrode hole. In such embodiments, forming a phase change material pattern further includes forming a phase change material pattern to extend through the guide hole and into the electrode hole to contact a sidewall of the electrode hole.

Patterning the insulation layer to form a guide hole and forming an electrode hole may include patterning the insulation layer to form the guide hole to expose a region of the heating electrode corresponding to the electrode hole and selectively etching the exposed region of the heating electrode to form the electrode hole. Patterning the insulation layer to form a guide hole may include patterning the insulation layer to form a guide hole having an inclined sidewall where a bottom end width of the guide hole is smaller than a top end width of the guide hole. Patterning the insulation layer to form a guide hole having an inclined sidewall and forming an electrode hole may include applying a patterning process including a slope-etch process to the insulation layer to form the guide hole exposing a region of the heating electrode corresponding to the electrode hole and having an inclined sidewall and selectively etching the exposed region of the heating electrode to form the electrode hole. Patterning the insulation layer to form a guide hole having an inclined sidewall and forming an electrode hole could also include patterning the insulation layer to form a guide hole exposing a region of the heating electrode corresponding to the electrode hole and applying a Radio Frequency (RF) sputter etch process to the insulation layer and the exposed region of the heating electrode to form the guide hole having an inclined sidewall and the electrode hole.

In additional embodiments of the present invention, patterning the insulation layer to form a guide hole and forming an electrode hole includes patterning the insulation layer to form the guide hole exposing a region of the heating electrode corresponding to the electrode hole, forming a spacer on an inner sidewall of the guide hole and using the spacer and the insulation layer as an etch mask and etching the heating electrode to form the electrode hole. Thus, a width of the electrode hole may be smaller than a width of the guide hole.

Further embodiments of the present invention include forming a conductive capping pattern on a top surface of the phase change material pattern where a sidewall of the conductive capping pattern is aligned to a sidewall of the phase change material pattern.

Some embodiments of the present invention also include forming an upper interlayer dielectric layer covering the phase change material pattern and forming an upper plug extending through the upper interlayer dielectric layer to electrically connect to the phase change material pattern.

Some embodiments of the present invention also provide a phase changeable memory device that includes an electrode having a thickness, a phase changeable material pattern in contact with the electrode and means for defining a contact region between the electrode and the phase changeable material pattern based on the thickness of the electrode. The means for defining may include a hole in the electrode such that the phase changeable material pattern only contacts the electrode at a sidewall of the hole.

Additional embodiments of the present invention provide a phase changeable memory device and methods of making a phase changeable memory device that include an electrode having an electrode hole therein and a phase changeable material pattern in contact with the electrode. The phase changeable material pattern only contacts the electrode at a sidewall of the hole.

DETAILED DESCRIPTION OF THE INVENTION

Figure 1:
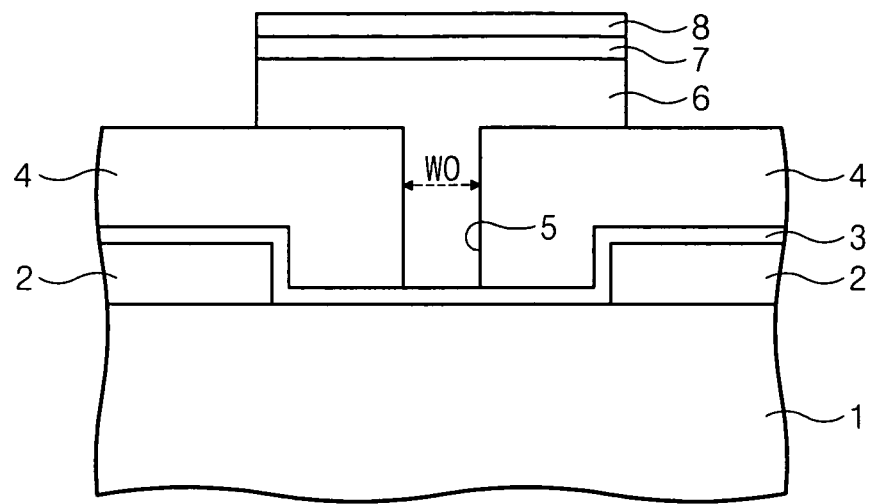
FIG. 1 is a cross-sectional view of a conventional phase change memory device.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Figure 2:
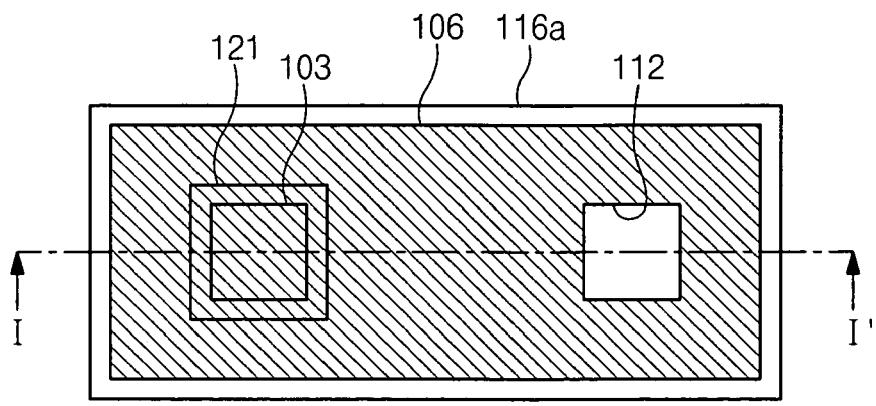
FIG. 2 is a plane view of phase change memory devices according to some embodiments of the present invention.
Figure 3:
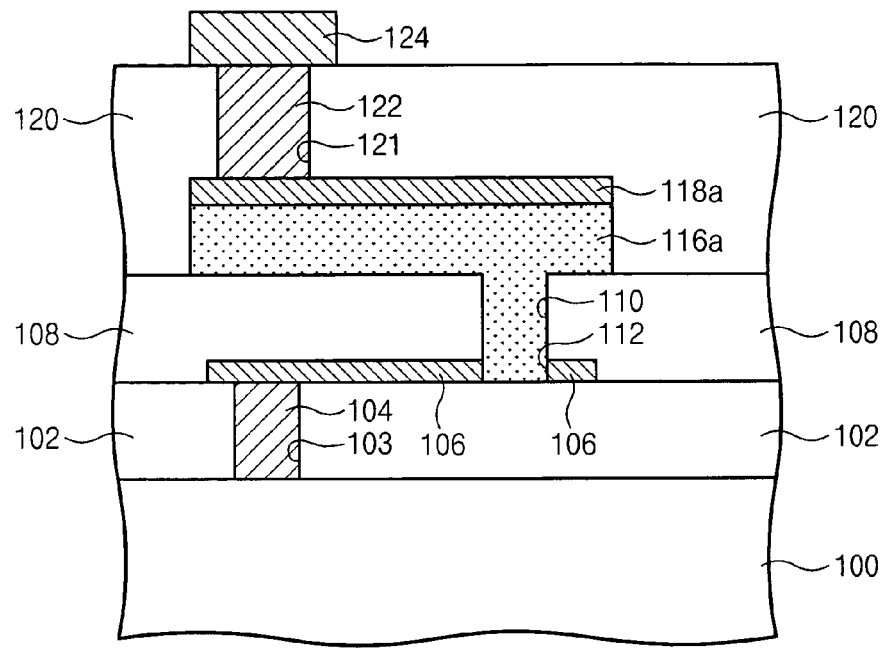
FIG. 3 is a cross-sectional view taken along a line I-I' in FIG. 2.

FIG. 2 is a plane view of phase change memory devices according to some embodiments of the present invention and FIG. 3 is a cross-sectional view taken along a line I-I' in FIG. 2.

Referring to FIGS. 2 and 3, the plane view of FIG. 2 is a layout of phase change memory devices according to some embodiments of the present invention. A lower interlayer dielectric layer 102 is disposed on a semiconductor substrate (hereinafter, referred to as a substrate) 100. A lower plug 104 is disposed in the lower interlayer dielectric layer 102. The lower plug 104 is filled in a lower contact hole 103 penetrating the lower interlayer dielectric layer 102 and exposing a predetermined region of the substrate 100. Therefore, the lower plug 104 contacts a predetermined region of the substrate 100. The lower plug 104 may contact an impurity diffusion layer (not shown) formed in the substrate 100. The impurity diffusion layer may be a source/drain region of, for example, a MOS field effect transistor (not shown). The impurity diffusion layer could also be one element of a PN diode, a bipolar transistor or the like.

The lower interlayer dielectric layer 102 may be made of a silicon oxide layer. The lower plug 104 may include a conductive material. For example, the lower plug 104 may be formed of metal (e.g. tungsten) or conductive material including nitrogen (e.g., titan nitrogen (TiN)).

A heating electrode 106 may be disposed on the lower interlayer dielectric layer 102. The heating electrode 106 may contact a top surface of the lower plug 104 electrically. That is, a bottom surface of the heating electrode 106 may contact the lower plug 104 to electrically couple the heating electrode 106 to the lower plug 104. The heating electrode 106 includes an electrode hole 112. The electrode hole 112 penetrates a predetermined region of the heating electrode 106 to expose a predetermined region of the lower interlayer dielectric layer 102.

The heating electrode 106 may include a conductive material containing nitrogen, a conductive material containing carbon, titanium, tungsten, molybdenum, tantalum, titanium silicide, and/or tantalum silicide. The conductive material containing nitrogen may be titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON) and/or tantalum oxynitride (TAON).

An insulation layer 108 is shown as disposed to cover the heating electrode 106. The insulation layer 108 covers the heating electrode 106 and at least a portion of the lower interlayer dielectric layer 102. The insulation layer 108 includes a guide hole 110. The guide hole 110 penetrates a predetermined region of the insulation layer 108. The inner space of the guide hole 110 is connected to an inner space of the electrode hole 112. The sidewall of the guide hole 110 may be connected to that of the electrode hole 112. As illustrated in FIG. 3, the sidewall of the guide hole 110 and the sidewall of the electrode hole 112 may be arranged in a straight line. In FIG. 2, a planar shape of the electrode hole 112 is illustrated as rectangle, however, other shapes of the electrode hole 112 may be utilized, such as a circle.

A phase change material pattern 116*a* and a conductive capping pattern 118*a* are disposed on the insulation layer 108 sequentially. A portion of the phase change material pattern 116*a* extends through the guide hole 110 to contact an inner sidewall of the electrode hole 112. The portion of the phase change material pattern 116*a* that extends through the guide hole 110 may fill the guide hole 110 and the electrode hole 112.

The phase change material pattern 116*a* may include a combination of Te, Se and/or Ge, Sb, Bi, Pb, Sn, Ag, As, S, Si, P, O and/or N. Specifically, the phase change material pattern 116*a* may include Ge—Sb—Te, As—Sb—Te, As—Ge—Sb—Te, Sn—Sb—Te, Ag—In—Sb—Te, In—Sb—Te, 5A group element-Sb—Te, 6A group element-Sb—Te, 5A group element-Sb—Se and/or 6A group element-Sb—Se, etc. The conductive capping pattern 118*a* may include a conductive material containing nitrogen, a conductive material containing carbon, titanium, tungsten, molybdenum, tantalum, titanium silicide, and/or tantalum silicide. The conductive material containing nitrogen may be titanium nitride (TiN), tantalum nitride (TaN), molybdenum nitride (MoN), niobium nitride (NbN), titanium silicon nitride (TiSiN), titan aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON) and/or tantalum oxynitride (TaON). In some embodiments of the present invention, the conductive capping pattern 118*a* may be the same material as the heating electrode 106.

The contact surface of the phase change material pattern 116*a* and the heating electrode 106 is an inner sidewall of the electrode hole 112. Therefore, an area of the contact surface may be decreased in comparison to that of the conventional device. That is, the contact surface depends on a thickness of the heating electrode 106 and a length of the perimeter of the electrode hole 112. In this case, the thickness of the heating electrode 106 may be formed to be much thinner that typically is provided as a minimum line width defined by a conventional photolithography process. As a result, an area of the contact surface may decrease in comparison to that of the conventional device.

In addition, even though a size of the electrode hole 112 may vary by the tolerance of the fabrication process, area variation of the contact surface may be decreased in some embodiments of the present invention as compared to that of a conventional device. More specifically, if the shapes of the electrode hole 112 and the conventional contact hole are circles having an identical radius, an area of the contact surface according to the present invention is $2\pi r_1 t$. In this case, $r_1$ is a radius of the electrode hole 112, and t is a thickness of the heating electrode 106. An area of the conventional contact surface is $\pi r_2^2$, and $r_2$ is a radius of the conventional contact hole. That is, for a circular contact hole, the contact area of the present invention is proportional to a radius of the electrode hole 112 but the conventional contact area is proportional to a square of the radius of the conventional contact hole. Therefore, if the sizes of the holes vary according to the tolerance of the fabrication process, area variation of the contact surface according to the present invention may decrease compared to the conventional device.

As a result, a contact area of the phase change material pattern 116*a* and the heating electrode 106 may be decreased over that of a conventional device, such that a density of the operation current flowing through the contact surface of the heating electrode 106 increases during a program or an erase operation. Thus, an amount of the operation current and/or power dissipation of the phase change memory device can be reduced.

Referring again to the embodiments of FIGS. 2 and 3, an upper interlayer dielectric layer 120 is disposed to cover the phase change material pattern 116*a*, a conductive capping pattern 118*a* and at least a portion of the insulation layer 108. The upper interlayer dielectric layer 120 may be formed of silicon oxide. An upper plug 122 is provided in an upper contact hole 121 penetrating the upper interlayer dielectric layer 120 to expose a predetermined region of the conductive capping pattern 118*a*. An interconnection 124 may be disposed on the upper interlayer dielectric layer 120. The interconnection 124 may contact a top surface of the upper plug 122.

The upper plug 122 may include a conductive material, that is, doped polysilicon, metal (e.g., tungsten), and/or conductive material containing nitrogen (e.g., titan nitrogen). The interconnection 124 may be formed of tungsten. In some embodiments of the present invention, the upper plug 122 may be a portion of the interconnection 124. That is, the interconnection 124 is extends into and, in some embodiments, fills the upper contact hole 121. In this case, a portion of the interconnection 124 in the upper contact hole 121 corresponds to the upper plug 122.

The upper plug 122 and the lower plug 104 may be arranged in a virtual line perpendicular to the substrate. That is, the upper plug 122 may be aligned over the lower plug 104. In this case, the guide hole 110 and the electrode hole 112 may be disposed in another perpendicular line different from the lower and upper plugs 104 and 122. Thus, in some embodiments, the guide hole 110 and the electrode hole 112 are offset in a lateral plane from the lower plug 104 and, in some embodiments, from the upper plug 122 and the lower plug 104.

In some embodiments of the present invention, the guide hole 110 and/or the electrode hole 112 may have different forms. Examples of alternative forms for the guide hole 110 and /or the electrode hole 112 are illustrated in FIGS. 4A and 4B.

Figure 4A:
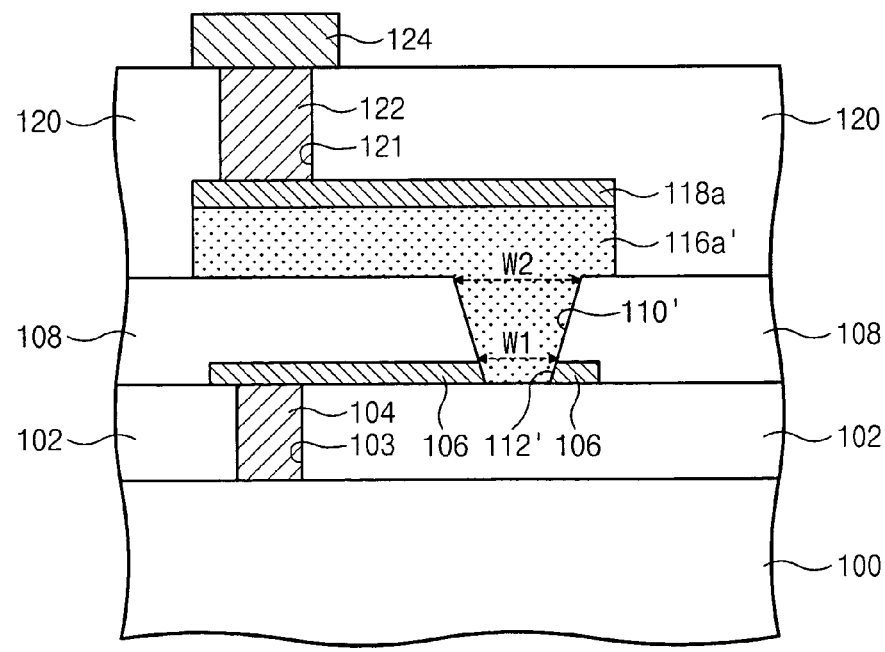
FIG. 4A is a cross-sectional view of phase change memory devices according to further embodiments of the present invention.

Referring to FIG. 4A, in some embodiments of phase change memory devices according to the present invention, a guide hole 110' has an inclined sidewall. In this case, a bottom portion-width W1 of the guide hole 110' may be smaller than a top portion-width W2 thereof. The sidewall of the electrode hole 112' may also be inclined and may be inclined to line up with the inclined sidewall of the guide hole 110'. The sidewall of the guide hole 110' is inclined, such that an aspect ratio of the guide hole 110' is relaxed and the phase change material pattern 116*a*' may more readily fill the guide hole 110' and/or the electrode hole 112'.

Figure 4B:
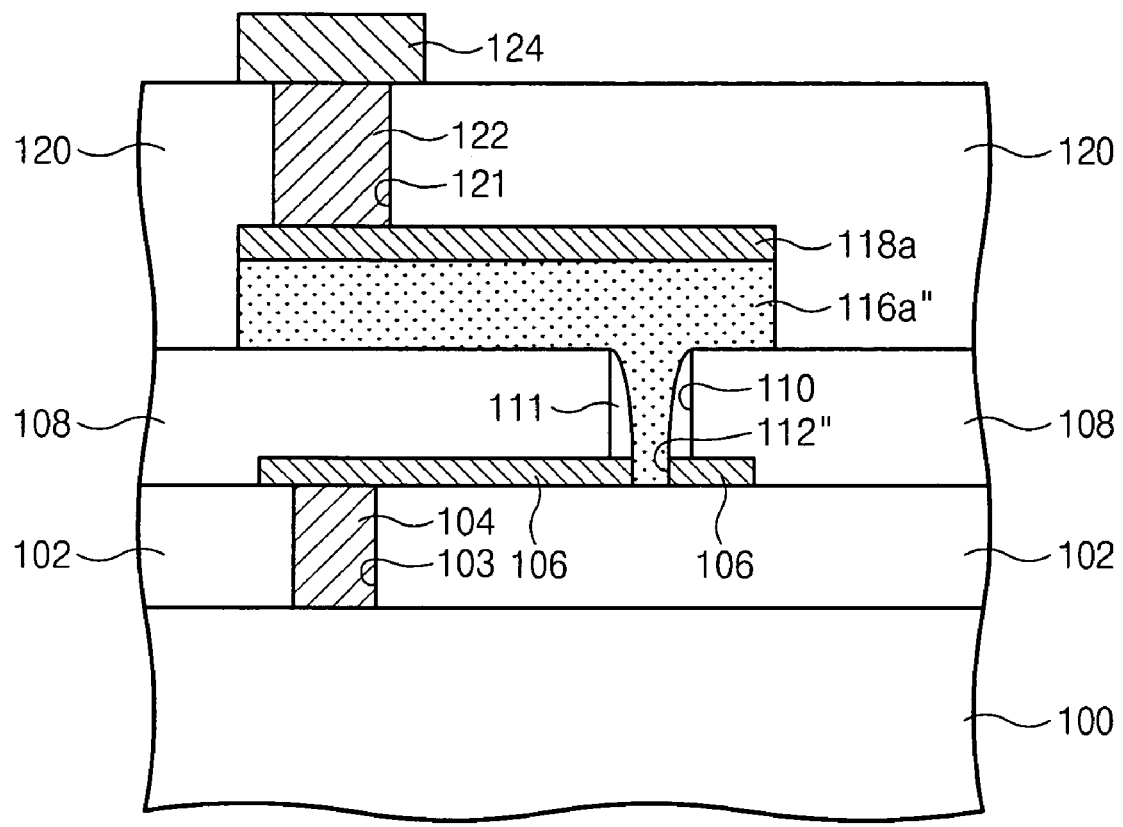
FIG. 4B is a cross-sectional view of phase change memory devices according to further embodiments of the present invention.

Referring to FIG. 4B, according to further embodiments of phase change memory devices according to the present invention, a spacer 111 may be disposed on a sidewall of the guide hole 110. In this case, the heating electrode 106 is extended in parallel beneath a bottom surface of the spacer 111. That is, the sidewall of the electrode hole 112" is aligned to the sidewall of the spacer 111 opposite a sidewall of the guide hole 110. Therefore, a width of the electrode hole 112" may be smaller than a width of the guide hole 110. As a result, a contact surface of the phase change material pattern 116a" and the heating electrode 106 may be further reduced.

Next, methods of forming phase change memory devices according to some embodiments of the present invention will be explained. FIGS. 5 through 8 are cross-sectional views illustrating methods of forming phase change memory devices according to some embodiments of the present invention. The cross-section views correspond to various stages in the fabrication process taken along a line I-I' in FIG. 2.

Figure 5:
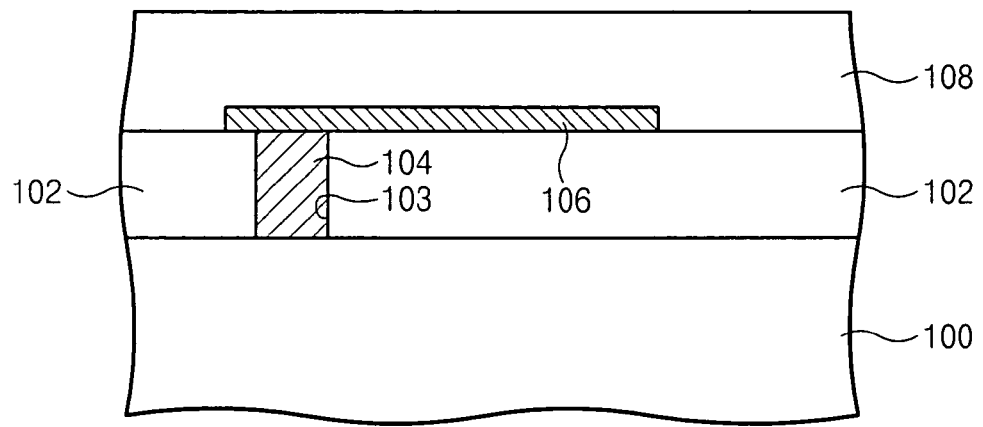
FIGS. 5 through 8 are cross-sectional views illustrating methods of forming phase change memory devices according to some embodiments of the present invention.

Referring to FIG. 5, a lower interlayer dielectric layer 102 is formed on the substrate 100. Before the lower interlayer dielectric layer 102 is formed, an impurity diffusion layer (not shown) may be formed in a predetermined region of the substrate 100. The impurity diffusion layer may correspond, for example, to a source/drain region of the MOS field effect transistor. Alternatively, the impurity diffusion layer may be one element of a PN diode, a bipolar transistor or the like. The lower interlayer dielectric layer 102 may be formed of silicon oxide.

The lower interlayer dielectric layer 102 is patterned to form a lower contact hole 103 exposing a predetermined region of the substrate 100. The lower contact hole 103 may expose a predetermined region of the impurity diffusion layer (not shown). A lower plug 104 is formed in the lower contact hole 103 and, in some embodiments, fills the lower contact hole 103. The lower plug 104 may be formed of doped polysilicon, metal (e.g., tungsten) and/or a conductive material including nitrogen (e.g., titanium nitrogen).

A heating electrode 106 is formed on a predetermined region of the lower interlayer dielectric layer 102 to contact a top surface of the lower plug 104. The heating electrode 106 may be formed of a conductive material containing nitrogen, a conductive material containing carbon, titanium, tungsten, molybdenum, tantalum, titanium silicide, and/or tantalum silicide. The conductive material containing nitrogen may be titanium nitride (TiN), tantalum nitride (TaN), molybdenum nitride (MoN), niobium nitride (NbN), titanium silicon nitride (TiSiN), titan aluminum nitride (TiAlN), titanium boron nitride (TiBN), zirconium silicon nitride. (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxynitride (TiON), titanium aluminum oxynitride (TiAlON), tungsten oxynitride (WON) and/or tantalum oxynitride (TaON).

An insulation layer 108 may be formed on a surface and, in some embodiments, an entire surface, of the substrate 100 in a region including the heating electrode 106. The insulation layer 108 may be made of a silicon oxide layer.

Figure 6:
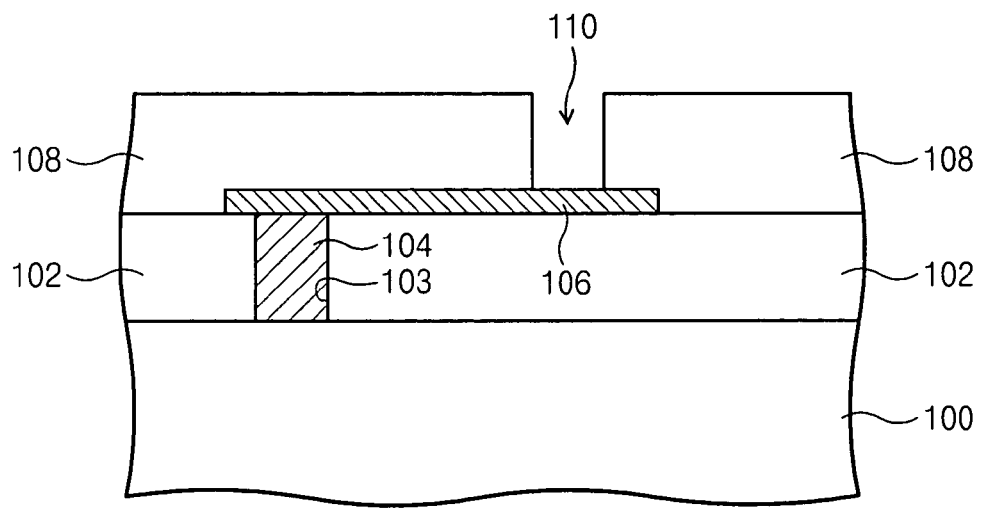
Figure 7:
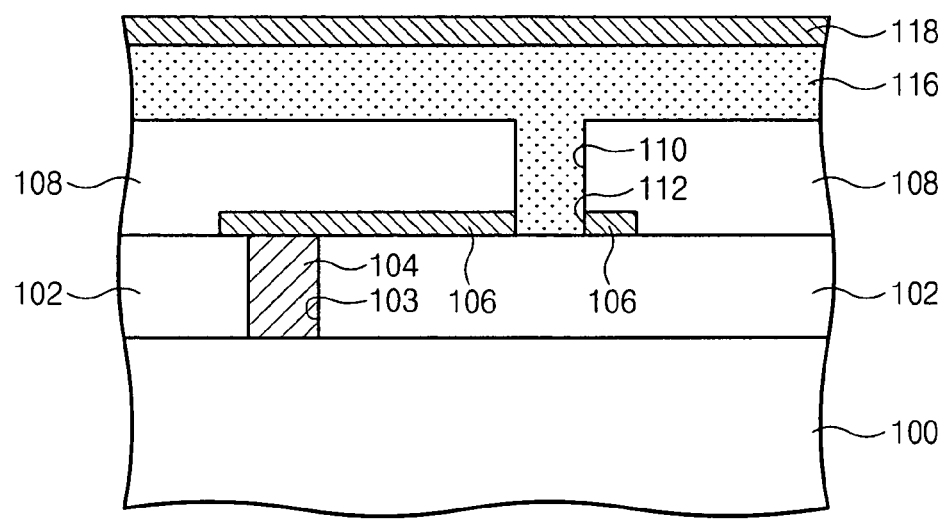

Referring to FIGS. 6 and 7, the insulation layer 108 is patterned to form a guide hole 110 exposing a predetermined region of the heating electrode 106. In this case, the patterning process may include a conventional anisotropic etch process.

The heating electrode 106 exposed in the guide hole 110 is etched to form an electrode hole 112 exposing a predetermined region of the lower interlayer dielectric layer 102. The etch process for forming the electrode hole 112 may be performed using a photolithographic pattern (not shown) used in a patterning process for forming the guide hole 106 as an etch mask. The etch process for forming the electrode hole 112 may also be performed using the insulation layer having the guide hole 110 as an etch mask.

The electrode hole 112 penetrates the heating electrode 106 and, in some embodiments, extends completely through the heating electrode 106. The electrode hole 112 may be self-aligned to a sidewall of the guide hole 110. Therefore, the sidewall of the electrode hole 112 and the sidewall of the guide hole 110 may be formed to be in a straight line, for example, a line perpendicular to a substrate.

A phase change material layer 116 is formed on a surface and, in some embodiments, an entire surface of the substrate 100 to extend into and, in some embodiments, fill the guide hole 110 and the electrode hole 112. A conductive capping layer 118 may be formed on the phase change material layer 116. The phase change material layer 116 may be formed of a compound combined with Te and/or Se and Ge, Sb, Bi, Pb, Sn, Ag, As, S, Si, P, O and/or N. For example, the phase change material layer 116 may be formed of Ge—Sb—Te, As—Sb—Te, As—Ge—Sb—Te, Sn—Sb—Te, Ag—In—Sb—Te, In—Sb—Te, 5A group element-Sb—Te, 6A group element-Sb—Te, 5A group element-Sb—Se and/or 6A group element-Sb—Se, etc. The conductive capping layer 118 may be formed of a conductive material containing nitrogen, a conductive material containing carbon, titanium, tungsten, molybdenum, tantalum, titanium silicide and/or tantalum silicide. The conductive material containing nitrogen may be formed of the same materials as those described above. In some embodiments, the conductive capping layer 118 may be formed of the same material as the heating electrode 106.

Figure 8:
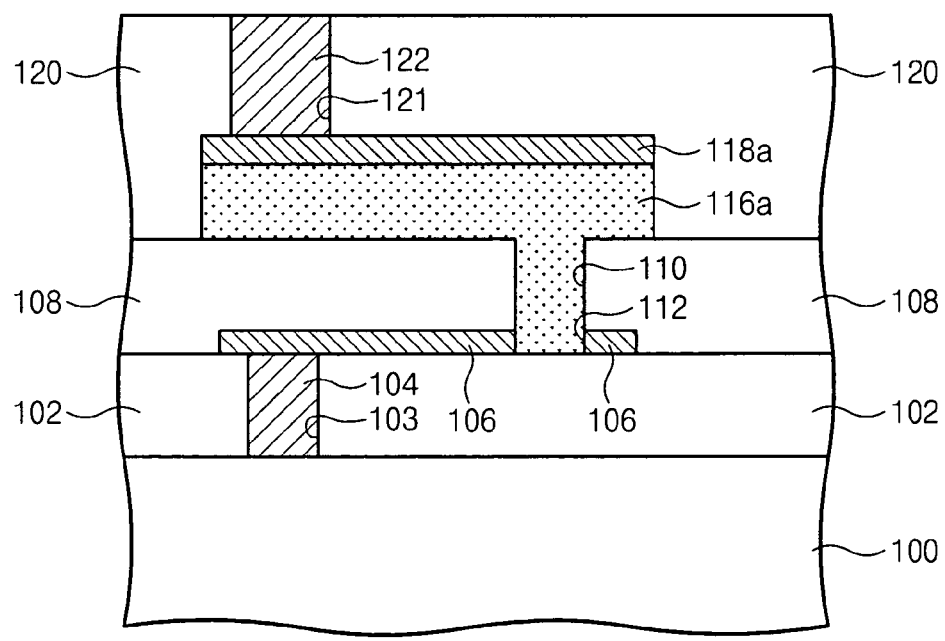

Referring to FIG. 8, the conductive capping layer 118 and the phase change material layer 116 are sequentially patterned to form a phase change pattern 116a and a conductive capping pattern 118a that are sequentially stacked. In this case, the phase change material pattern 116a extends into and, in some embodiments, fills the guide hole 110 and the electrode hole 112. Therefore, the phase change material pattern 116a contacts a sidewall of the electrode hole 112. That is, a contact surface of the phase change material pattern 116a and the heating electrode 106 is an inner sidewall of the electrode hole 112. A bottom surface of the phase change material pattern 116a contacts the lower interlayer dielectric layer 102. The phase change material pattern 116a is placed in the electrode hole 112.

An upper interlayer dielectric layer 120 may be formed on a surface of and, in some embodiments, an entire surface of the substrate 100 in a region including the conductive capping pattern 118a and the phase change material pattern 116a.

The upper interlayer dielectric layer 120 is patterned to form an upper contact hole 121 for exposing a predetermined region of the conductive capping pattern 118a. An upper plug 122 is formed to fill the upper contact hole 121. The upper plug 122 may be formed of metal, such as tungsten, and/or a material containing nitrogen such as titanium nitride. The upper plug 122 and the lower plug 104 may be formed aligned to a virtual line perpendicular to the top surface of the substrate 100. In this case, the guide hole 110 and the electrode 112 are aligned to another perpendicular line different from that of the upper and the lower plugs 104 and 122.

An interconnection 124 shown in FIG. 3 may also be formed on the upper interlayer dielectric layer 120. The upper plug 122 may be a portion of the interconnection 124. That is, after the upper contact hole 121 is formed, an interconnection conductive layer (not shown) for extending into and, in some embodiments, filling the upper contact hole 121 may be formed on a surface and, in some embodiments, an entire surface of the substrate 100 and then the interconnection conductive layer may be patterned to form the interconnection 124. In this case, a portion of the interconnection 124 extends into the contact hole 121, such that the upper plug 122 is formed as a portion of the interconnection 124.

Methods for forming the guide hole 110' and the electrode hole 112' in FIG. 4A will now be explained for some embodiments of the present invention referring to FIGS. 5, 6 and 4A. Referring to FIGS. 5 and 4A, in some embodiments of the present invention for forming a guide hole 110' and an electrode hole 112', a patterning process including a slope-etch process is applied to the insulation layer 108 formed on the substrate 100 so as to form a guide hole 110' for exposing a predetermined region of the heating electrode 106. The slope-etch process makes a sidewall of the guide hole 110' inclined. In this case, a bottom portion-width W1 of the guide hole 110' is smaller than a top portion-width W2 thereof.

The heating electrode 106 exposed in the guide hole 110' may be selectively etched to form the electrode hole 112'. A sidewall of the electrode hole 112' may be formed to be inclined because of the inclined sidewall of the guide hole 110'.

Alternatively, the guide hole 110' and the electrode hole 112' may be formed by other methods explained below referring to FIGS. 6 and 4A. Referring to FIGS. 6 and 4A, in other methods of forming the guide hole 110' and the electrode hole 112', the insulation layer 108 is patterned to form a guide hole 110 for exposing a predetermined region of the heating electrode 106. In this case, the patterning process may be performed by a conventional anisotropic etch technique. The patterning process for forming the guide hole 110 includes a process for removing a photolithography pattern (not shown). Therefore, the insulation layer 108 may be exposed.

A RF sputter etch process is applied to the substrate 100 including the exposed heating electrode 106 and the insulation layer 108 so as to form an electrode hole 112'. In this case, a portion of the sidewall of the guide hole 110 may be etched. An upper portion of the sidewall of the guide hole 110 is etched further than a lower portion thereof. As a result, the electrode hole 112' and the guide hole 110' are formed. The electrode hole 112' and the guide hole 110' may be formed concurrently. The subsequent processing may be performed in the same manner as those described with reference to FIGS. 7 and 8.

A sidewall of the guide hole 110' is shown as formed to be inclined, such that an aspect ratio of the guide hole 110' is relaxed. Therefore, the phase change material layer 116a may be capable of more readily filling the guide hole 110' and the electrode hole 112'.

Figure 9:
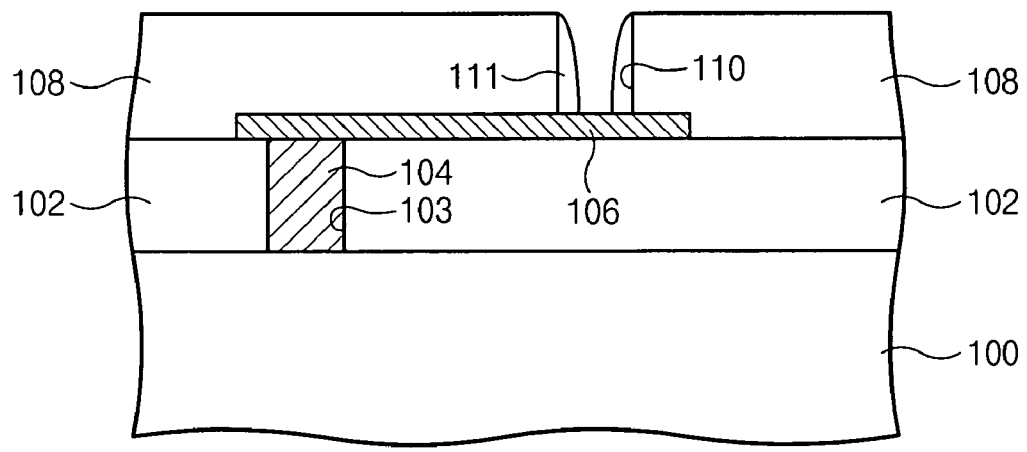
FIGS. 9 through 10 are cross-sectional views illustrating methods of forming phase change memory devices according to further embodiments of the present invention.
Figure 10:
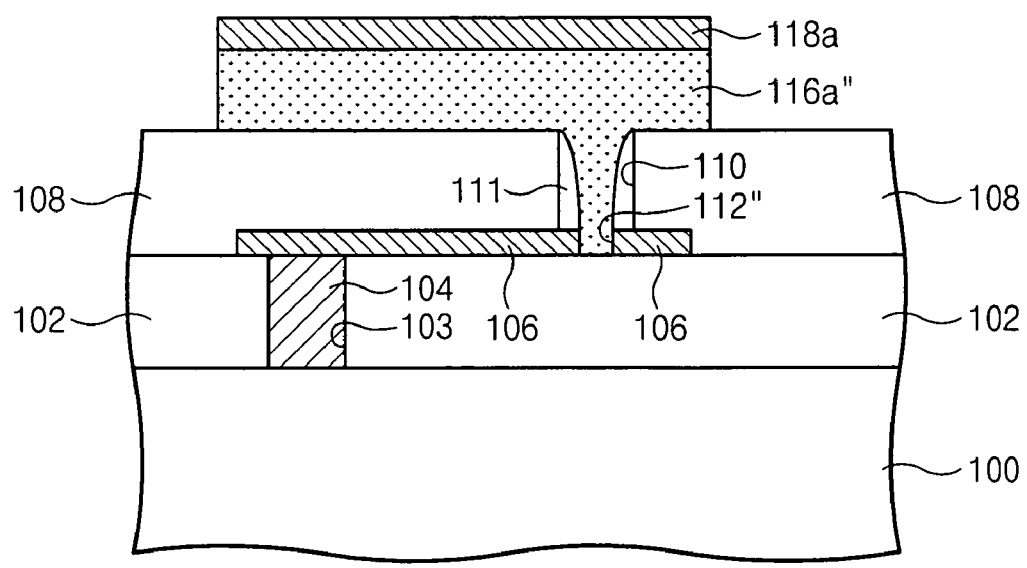

Methods of forming the phase change memory devices in FIG. 4B will now be explained for some embodiments of the present invention referring to FIGS. 9 and 10. Referring to FIGS. 6, 9, and 10, a patterning process including a conventional anisotropic etch process may be applied to the insulation layer 108 formed on the substrate 100, so as to form a guide hole 110 for exposing a predetermined region of the heating electrode 106. A spacer 111 is formed on an inner sidewall of the guide hole 110. The spacer 111 may be formed of insulating material having an etch selectivity with respect to the heating electrode 106. For example, the spacer 111 may be formed of silicon nitride, silicon oxynitride and/or silicon oxide.

The exposed portion of the heating electrode 106 may be etched to form an electrode hole 112" that extends through the heating electrode 106 to expose a portion of the lower interlayer dielectric layer 102 using the insulation layer 108 and the spacer 111 as an etch mask. Therefore, a width of the electrode hole 112" may be formed to be smaller than that of the guide hole 110. After this, the subsequent processing may be performed in a manner similar to those described with reference to FIGS. 7 and 8.

The electrode hole 112" may be formed to have a width smaller than the guide hole 110 because of the spacer 111. Therefore, a contact area of the heating electrode 106 and the phase change material pattern 116a" may be further decreased. Moreover, if the guide hole 110 is formed to have a minimum line width within a limitation of the photolithographic process, the electrode hole 112" may be formed to have a width smaller than the minimum line width within the limitation of the photolithographic process.

According to some embodiments of the present invention, the heating electrode includes an electrode hole penetrating a predetermined region thereof and a phase change material pattern contacting an inner sidewall of the electrode hole. Therefore, a contact area of the heating electrode and the phase change material pattern may correspond to an area of the inner sidewall of the electrode hole. That is, a thickness of the heating electrode may be reduced which may reduce the contact area of the phase change material pattern and the heating electrode and the contact area may be decreased in comparison to a conventional device. As a result, an operation current for a state conversion of the phase change material pattern may be reduced so as to decrease a power dissipation of the phase change memory device. In addition, because the operation current decreases, sizes of other discrete devices (e.g., MOS transistor) of the phase change memory device may also be decreased. Therefore, the phase change memory device may be suitable for high integration.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A phase change memory device, comprising:
   a heating electrode disposed on a substrate, the heating electrode including an electrode hole extending through the heating electrode; and
   a phase change material pattern in the electrode hole and contacting a sidewall of the electrode hole.

2. The device of claim 1, further comprising an insulation layer on the heating electrode and including a guide hole extending through the insulation layer,
   wherein the phase change material pattern is disposed on the insulation layer and in the guide hole, and
   wherein a portion of the phase change material pattern extends through the guide hole to the electrode hole and contacts the sidewall of the electrode hole.

3. The device of claim 2, wherein the sidewall of the electrode hole and the sidewall of the guide hole are arranged in a straight line.

4. The device of claim 2, wherein the sidewall of the guide hole is inclined, and a bottom end width of the guide hole is smaller than a top end width the guide hole.

5. The device of claim 2, further comprising a spacer on the sidewall of the guide hole and on the heating electrode and wherein a width of the electrode hole is smaller than a width of the guide hole.

6. The device of claim 1, further comprising a conductive capping pattern disposed on a top surface of the phase change material pattern, wherein the conductive capping pattern has a sidewall aligned to a sidewall of the phase material pattern.

7. The device of claim 1, further comprising:
   a lower dielectric layer interposed between the heating electrode and the substrate; and
   a lower plug extending through the lower dielectric layer to contact a predetermined region of the substrate, a top surface of the lower plug being electrically connected to the heating electrode.

8. The device of claim 7, further comprising:
an upper dielectric layer covering the phase change material pattern; and
an upper plug extending through the upper dielectric layer to electrically connect to the phase change material pattern.

9. The device of claim 8, wherein the lower plug and the upper plug are aligned to a virtual line perpendicular to a top surface of the substrate.

10. The device of claim 8, wherein the guide hole and the electrode hole are offset from the lower plug and/or the upper plug.

11. The device of claim 1, wherein the phase change material pattern only contacts the heating electrode through a sidewall of the electrode hole.

* * * * *